(12) United States Patent
Shyu et al.

(10) Patent No.: US 7,103,238 B2
(45) Date of Patent: Sep. 5, 2006

(54) COB PACKAGE TYPE BI-DIRECTIONAL TRANSCEIVER MODULE

(75) Inventors: Hauen Chyun Shyu, Hsinchu (TW); Yaw-Yeu Guan, Hsinchu (TW)

(73) Assignee: Radiantech, Inc., (TW)

( * ) Notice: Subject to any disclaimer, the term of this patent is extended or adjusted under 35 U.S.C. 154(b) by 53 days.

(21) Appl. No.: 10/845,157

(22) Filed: May 14, 2004

(65) Prior Publication Data

US 2005/0036730 A1 Feb. 17, 2005

(30) Foreign Application Priority Data

Aug. 15, 2003 (TW) ............................... 92214860 U

(51) Int. Cl.
*G02B 6/12* (2006.01)
*H04B 10/00* (2006.01)

(52) U.S. Cl. .......................... 385/14; 385/88; 385/92; 398/79; 398/135; 398/138; 398/139

(58) Field of Classification Search .................. 385/24, 385/88, 89, 92, 93, 94, 14; 398/79, 135, 398/138, 139
See application file for complete search history.

(56) References Cited

U.S. PATENT DOCUMENTS

| 5,566,265 | A * | 10/1996 | Spaeth et al. .................. 385/93 |
| 6,493,121 | B1 * | 12/2002 | Althaus ....................... 398/135 |
| 6,731,882 | B1 * | 5/2004 | Althaus et al. .............. 398/139 |
| 2005/0036730 | A1 * | 2/2005 | Shyu et al. .................... 385/14 |
| 2005/0053338 | A1 * | 3/2005 | Chou et al. .................... 385/93 |

OTHER PUBLICATIONS

Ivarsson et al., "EriOpto— A new family of Optical transceivers", Ericsson Review No. 1 1997 pp. 24-34.*

* cited by examiner

*Primary Examiner*—Brian M. Healy
(74) *Attorney, Agent, or Firm*—VENABLE, LLP; James R. Burdett; Jeffri A. Kaminski

(57) ABSTRACT

A COB (Chip On Board) package type bi-directional transceiver module is disclosed to include a photosensitive member bonded to a printed circuit board by COB (Chip On Board) package and adapted for receiving a first optical signal, and a light source installed by TO-can package and adapted for transmitting a second optical signal.

16 Claims, 4 Drawing Sheets

COB PACKAGE TYPE BI-DIRECTIONAL TRANSCEIVER MODULE

BACKGROUND OF THE INVENTION

1. Field of the Invention

The present invention relates to a bidirectional transceiver module and more particularly, to a COB package type bi-directional transceiver module, which has the photo diode bonded to the printed circuit board by COB (chip on board) package and the laser diode installed by means of TO package.

2. Description of the Related Art

A bi-directional WDM (wavelength division multiplexer) transceiver module is capable of transmitting and receiving two light sources of different wavelengths (1550/1330 nm) through a SMF (Single Mode Fiber), achieving bi-directional transmission operation. This bi-directional transmission design increases the use of the bandwidth of a fiber. In comparison to the design of conventional bi-directional fiber optic transmission modules, this bi-directional transmission design saves one fiber optic, minimizes module size, and increases the use of bandwidth in high density main distribution facility room.

FIG. 1 is a schematic drawing of a bi-directional WDM transceiver module according to the prior art. According to this design, the bi-directional WDM transceiver module comprises a laser diode 11, a photo diode 12, a WDM (wavelength division multiplexer) 13, a filter 14, and a module housing 17 houses the members. The bi-directional WDM transceiver module is connectable to a SMF (Single Mode Fiber) 16 through a fiber optic connector 15 (for example, a receptacle, pigtail, or the like) for bi-directional transmission of signal. The bi-directional WDM transceiver module uses the laser diode 11 as light source that receives electric signal from driver and converts the signal into optical signal of wavelength $\lambda_1$ (for example, 1550 nm) for transmission. The bi-directional WDM transceiver module uses the photo diode 12 as photosensitive means to receive optical signal of wavelength $\lambda_2$ (for example, 1310 nm) and to convert the signal into an electric signal, for enabling the electric signal to be amplified by a TIA (Transimpedance Amplifier) for output. The WDM 13 is adapted to separate the light sources of wavelength $\lambda_1$ and wavelength $\lambda_2$, for enabling optical signal of $\lambda_1$ from laser diode 11 to pass through WDM 13 to the SMF 16 for output. Optical signal of $\lambda_2$ from SMF 16 is reflected onto the filter 14 by the WDM 13 and then sent received by the photo diode 12. Therefore, the bi-directional WDM transceiver module achieves bi-directional transmission operation.

The manufacturing of the aforesaid prior art bi-directional WDM transceiver module is started from the laser diode 11 which is housed in a TO package, and then the ferrule of the fiber optic connector 15 is aligned to the laser diode 11 and welded on the module housing 17, and then the photo diode 12, which is also housed in a TO package, and the other components are mounted in the module housing 17, completing OSA (Optical Sub-assembly) manufacturing process, forming a structure of bi-directional transceiver as shown in FIG. 2. During the manufacturing process of the bi-directional transceiver, the LD adopts TO packaging, and the photo diode can also adopts TO packaging.

In order to satisfy heavy bandwidth requirement for telecommunication and network, optical communication networks will become more and more popular in city areas. However, due to limited land space and heavy rent for office in city areas, there is a limitation to the expansion of trucking space. Therefore, it is important to provide more number of transmission ports with same size of telecommunication and network facility. The most effective and direct way to solve the problem is to reduce the size of the bi-directional transceiver so that more transmission ports can be provided in a limited space.

SUMMARY OF THE INVENTION

The present invention has been accomplished under the circumstances in view. It is the main object of the present invention to provide a COB (Chip On Board) package type bi-directional transceiver module, which has the photo diode directly bonded to the signal receiving and amplifying printed circuit board of bi-directional transceiver at the same side that optical signal comes in by means of COB (Chip On Board) package to effectively save the module size, eliminating the use of conventional TO package and lead wires.

According to one embodiment of the present invention, the COB (Chip On Board) package type bi-directional transceiver module comprises a photosensitive member bonded to a signal receiving and amplifying printed circuit board of bi-directional transceiver at the same side that optical signal comes in by COB (Chip On Board) package and adapted for receiving a first optical signal, and a light source installed by TO-can package and adapted for transmitting a second optical signal. The photosensitive member can be a photo diode, preferably, a PIN photo diode. The light source can be a laser diode. The wavelength of the first optical signal is 1550 nm, and the wavelength of the second optical signal is 1310 nm. Alternatively, the COB (Chip On Board) package type bi-directional transceiver module can be so made that the first optical signal has the wavelength of 1310 nm, and the second optical signal has the wavelength of 1550 nm. The COB (Chip On Board) package type bi-directional transceiver module further comprises a WDM (Wavelength Division Multiplexer) adapted to separate the first optical signal and the second optical signal.

According to a second embodiment of the present invention, the COB (Chip On Board) package type bi-directional transceiver module comprises a photosensitive member adapted for bonding to a signal receiving and amplifying circuit board at the same side that optical signal comes in by COB (Chip On Board) package for receiving a first optical signal, and a light source adapted for bonding to a laser driving circuit board thereof at the same side that optical signal emits out by COB (Chip On Board) package for transmitting a second optical signal. According to this embodiment, the photosensitive member can be a photo diode, preferably a PIN photo diode, and the light source can be a laser diode. The photosensitive member and the light source can be bonded to a common printed circuit board. Alternatively, the photosensitive member and the light source can respectively be bonded to a respective printed circuit board. The wavelength of the first optical signal is 1550 nm, and the wavelength of the second optical signal is 1310 nm. Alternatively, the COB (Chip On Board) package type bi-directional transceiver module can be so made that the first optical signal has the wavelength of 1310 nm, and the second optical signal has the wavelength of 1550 nm. The COB (Chip On Board) package type bi-directional transceiver module further comprises a WDM (Wavelength Division Multiplexer) adapted to separate said first optical signal and said second optical signal.

DETAILED DESCRIPTION OF THE PREFERRED EMBODIMENT

Figure 1:
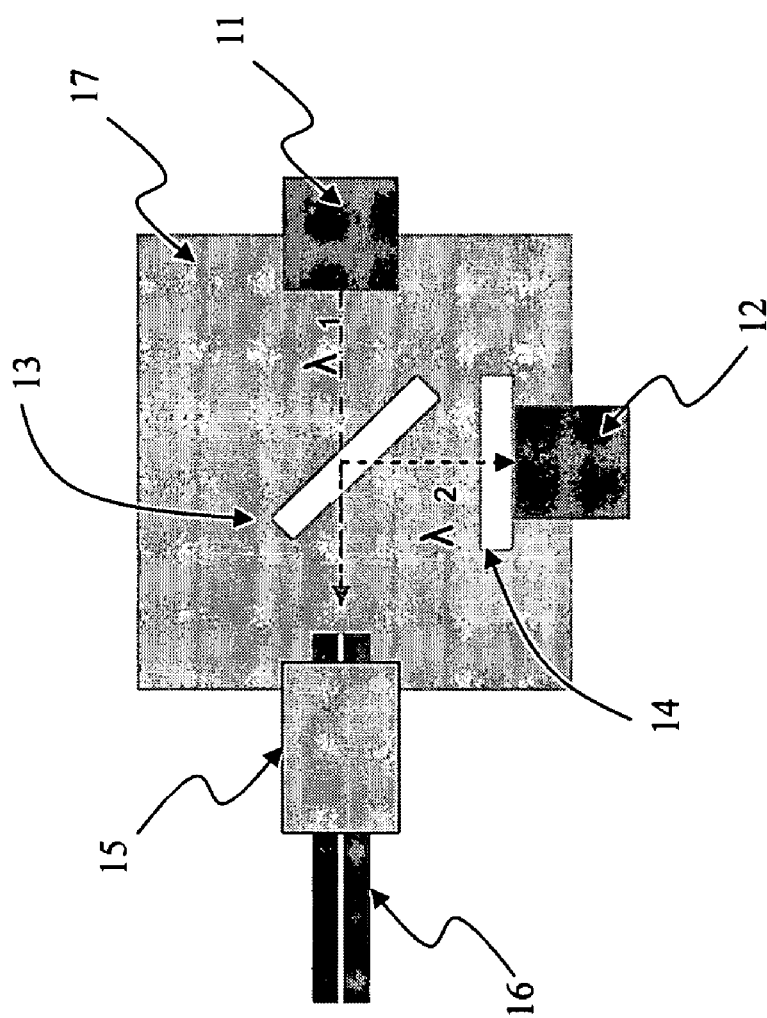
FIG. 1 is a schematic drawing showing the arrangement of a bi-directional transceiver module according to the prior art.
Figure 2:
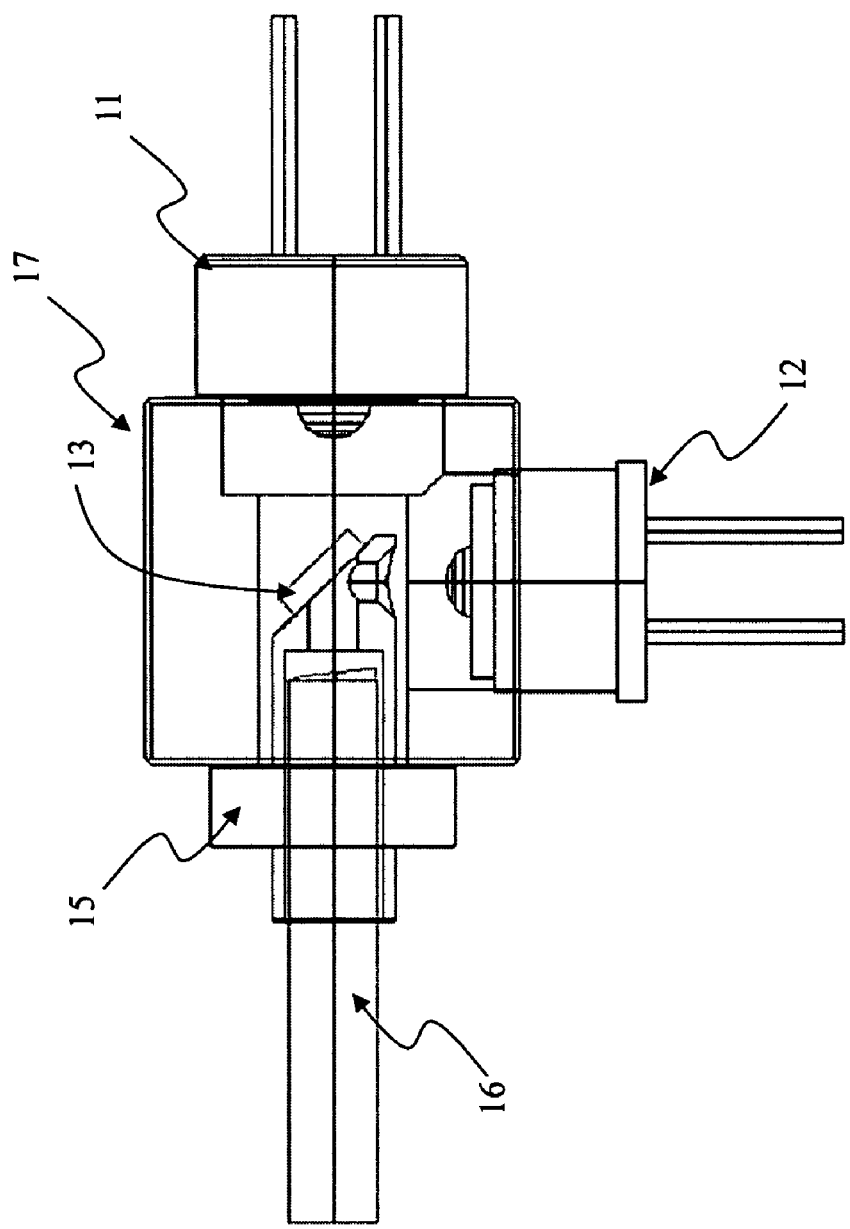
FIG. 2 is a schematic structural view of the prior art bi-directional transceiver module.
Figure 3:
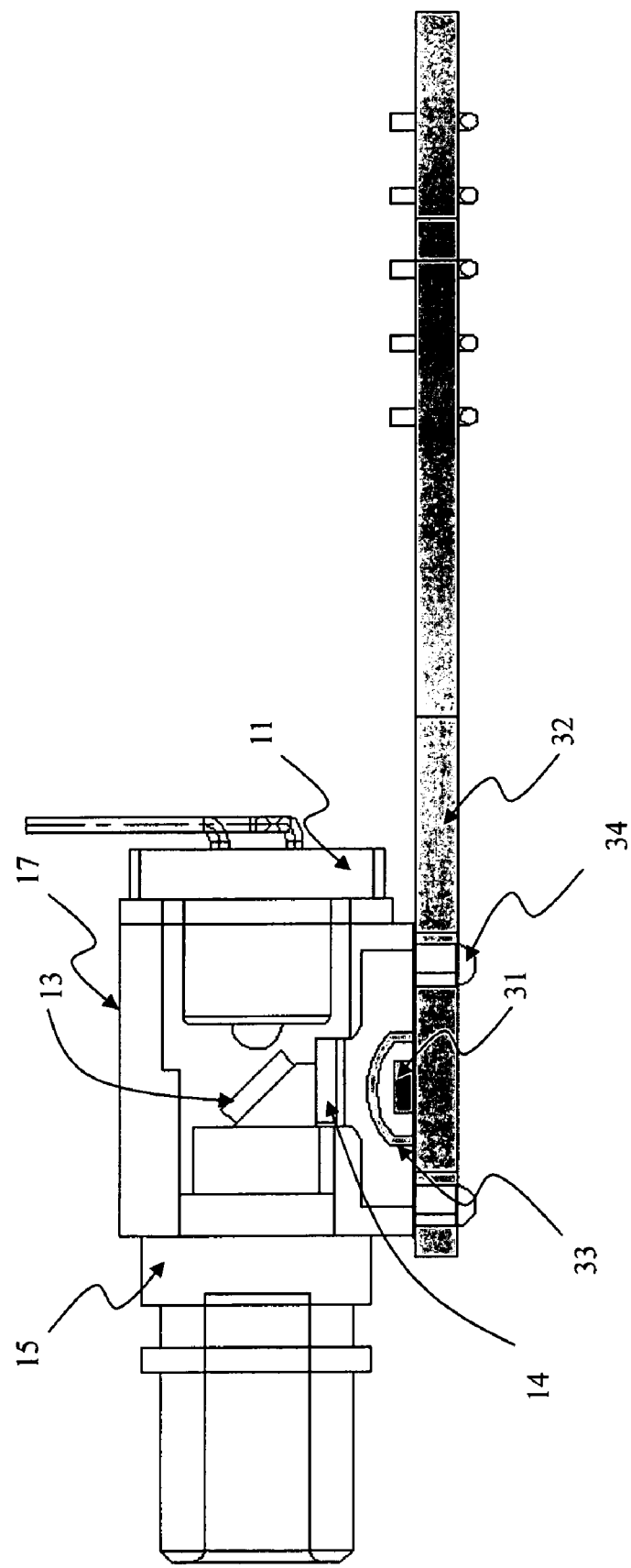
FIG. 3 is a schematic plain view of a COB (Chip On Board) package type bi-directional transceiver module according to the present invention.

Referring to FIG. 3, a bi-directional transceiver module is shown comprising a chip photo diode 31 directly bonded to a circuit board 32 at the same side that optical signal comes in by means of COB (Chip On Board) package and electrically connected to a signal receiving and amplifying circuit by wire bonding, a protective shield 33 with a lens therein covered over the chip photo diode 31 for condensing the focus, a laser diode 11 installed by TO package, a WDM (wavelength division multiplexer) 13, a filter 14, a fiber optic connector 15, and a module housing 17. The WDM 13 is adapted to separate optical signals of different wavelengths (the first optical signal and the second optical signal) from the laser diode 11 and the chip photo diode 31. The laser diode 11 and the fiber optic connector 15 are engrafted on the module housing 17 by laser welding and prior art alignment technique so that the light emits from the laser diode 11, passes through the WDM 13, enters the fiber optic connector 15, and goes out from the transceiver. The module housing 17 is made of metal and equipped with two pins 34. Pin 34 intersects the PCB and locates the module housing 17 at a specific position on PCB so that the light coming from outside and entering the fiber optic connector 15 is reflected by the WDM 13, passes through the filter 14 and protective shield 33, and directs to the chip photo diode 31.

Figure 4:
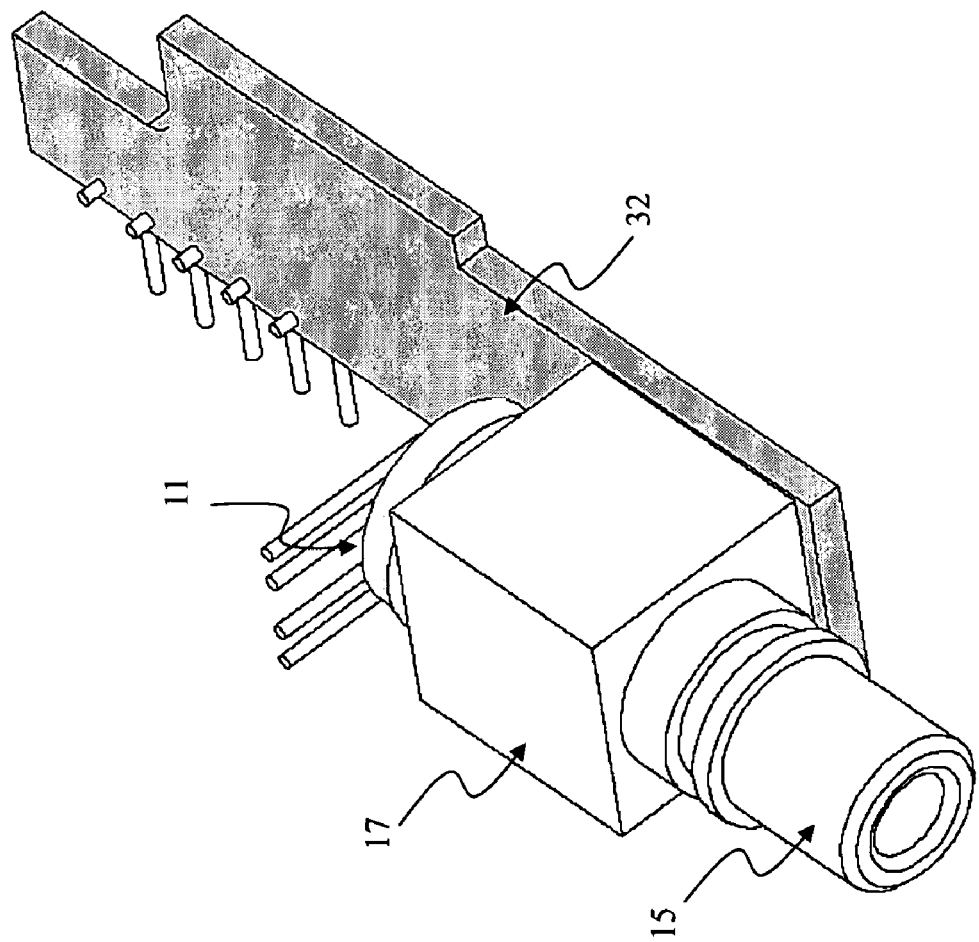
FIG. 4 is an elevational view of the COB (Chip On Board) package type bi-directional transceiver module according to the present invention.

Referring to FIG. 4, the chip photo diode is installed by means of COB package, and the laser diode is installed by means of TO package. Alternatively, the chip photo diode and the laser diode both can be installed by COB package to minimize the size of the bi-directional transceiver module.

As indicated above, the invention uses COB (Chip On Board) package to directly bond the photo diode to the printed circuit board at the same side that optical signal comes in to reduce the module size, while having the laser diode installed by means of TO package. Using COB package to bond the photo diode to the printed circuit board instead of TO package greatly reduce the module size. Therefore, the invention enables an optical communication facility to provide more number of communication ports without increasing the size. Because of reduced size, signal transmission distance is relatively reduced, resulting in low noise and high reliability.

A prototype of COB (Chip On Board) package type bi-directional transceiver module has been constructed with the features of the annexed drawings of FIGS. 3 and 4. The COB (Chip On Board) package type bi-directional transceiver module functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A COB (Chip On Board) package type bi-directional transceiver module comprising
    a photosensitive member adapted for receiving a first optical signal and bonded to a printed circuit board by COB (Chip On Board) package at the same side that the first optical signal comes in; and
    a light source installed by TO-can package and adapted for transmitting a second optical signal.

2. The COB (Chip On Board) package type bi-directional transceiver module as claimed in claim 1, wherein said photosensitive member is a photo diode.

3. The COB (Chip On Board) package type bi-directional transceiver module as claimed in claim 2, wherein said photo diode is a PIN photo diode.

4. The COB (Chip On Board) package type bi-directional transceiver module as claimed in claim 1, wherein said light source is a laser diode.

5. The COB (Chip On Board) package type bi-directional transceiver module as claimed in claim 1, wherein the wavelength of said first optical signal is 1550 nm, and the wavelength of said second optical signal is 1310 nm.

6. The COB (Chip On Board) package type bi-directional transceiver module as claimed in claim 1, wherein the wavelength of said first optical signal is 1310 nm, and the wavelength of said second optical signal is 1550 nm.

7. The COB (Chip On Board) package type bi-directional transceiver module as claimed in claim 1, further comprising a WDM (Wavelength Division Multiplexer) adapted to separate said first optical signal and said second optical signal.

8. A COB (Chip On Board) package type bi-directional transceiver module comprising a photosensitive member for receiving a first optical signal and adapted for bonding to a circuit board by COB (Chip On Board) package at the same side that the first optical signal comes in, and a light source for transmitting a second optical signal and adapted for bonding to a circuit board thereof by COB (Chip On Board) package at the same side that the second optical signal emits out.

9. The COB (Chip On Board) package type bi-directional transceiver module as claimed in claim 8, wherein said photosensitive member is a photo diode.

10. The COB (Chip On Board) package type bi-directional transceiver module as claimed in claim 9, wherein said photo diode is a PIN photo diode.

11. The COB (Chip On Board) package type bi-directional transceiver module as claimed in claim 8, wherein said light source is a laser diode.

12. The COB (Chip On Board) package type bi-directional transceiver module as claimed in claim 8, wherein said photosensitive member and said light source are bonded to a common printed circuit board.

13. The COB (Chip On Board) package type bi-directional transceiver module as claimed in claim 8, wherein said photosensitive member and said light source are respectively bonded to a respective printed circuit board.

14. The COB (Chip On Board) package type bi-directional transceiver module as claimed in claim 8, wherein the wavelength of said first optical signal is 1550 nm, and the wavelength of said second optical signal is 1310 nm.

15. The COB (Chip On Board) package type bi-directional transceiver module as claimed in claim 1, wherein the wavelength of said first optical signal is 1310 nm, and the wavelength of said second optical signal is 1550 nm.

16. The COB (Chip On Board) package type bi-directional transceiver module as claimed in claim 8, further comprising a WDM (Wavelength Division Multiplexer) adapted to separate said first optical signal and said second optical signal.

* * * * *